(12) United States Patent
Trout et al.

(10) Patent No.: US 11,749,920 B2
(45) Date of Patent: Sep. 5, 2023

(54) DIRECT PLUG ORTHOGONAL BOARD TO BOARD CONNECTOR SYSTEM

(71) Applicant: TE Connectivity Services GmbH, Schaffhausen (CH)

(72) Inventors: David Allison Trout, Lancaster, PA (US); Justin Dennis Pickel, Hummelstown, PA (US); Timothy Robert Minnick, Enola, PA (US); Chad William Morgan, Carney's Point, NJ (US); Jeffrey Byron McClinton, Harrisburg, PA (US)

(73) Assignee: TE CONNECTIVITY SOLUTIONS GMBH, Schaffhausen (CH)

( * ) Notice: Subject to any disclaimer, the term of this patent is extended or adjusted under 35 U.S.C. 154(b) by 80 days.

(21) Appl. No.: 17/548,654

(22) Filed: Dec. 13, 2021

(65) Prior Publication Data

US 2023/0187859 A1 Jun. 15, 2023

(51) Int. Cl.
*H01R 12/70* (2011.01)
*H01R 12/73* (2011.01)
*H01R 12/72* (2011.01)

(52) U.S. Cl.
CPC ....... *H01R 12/7076* (2013.01); *H01R 12/724* (2013.01); *H01R 12/737* (2013.01); *H05K 2201/044* (2013.01)

(58) Field of Classification Search
CPC ............. H01R 12/7076; H01R 12/724; H01R 12/737; H05K 2201/044
USPC .......................................................... 439/78
See application file for complete search history.

(56) References Cited

U.S. PATENT DOCUMENTS

| 3,348,191 | A | | 10/1967 | Kinkaid |
| 3,530,422 | A | | 9/1970 | Goodman |
| 5,692,928 | A | * | 12/1997 | Nelson ............ H01R 13/41 439/733.1 |
| 6,790,102 | B2 | * | 9/2004 | Stillabower ........ H05K 3/368 439/876 |
| 6,997,760 | B2 | | 2/2006 | Tsai |
| 9,548,570 | B2 | * | 1/2017 | Laurx .............. H01R 12/737 |

FOREIGN PATENT DOCUMENTS

| CN | 101120490 A | * | 2/2008 | ........ H01R 12/716 |
| CN | 101120491 A | * | 2/2008 | ....... H01R 13/6587 |
| GB | 1049435 | * | 11/1996 | |
| WO | WO-2011015445 A1 | * | 2/2011 | ........... H01R 12/58 |
| WO | 201115445 A1 | | 10/2011 | |

* cited by examiner

*Primary Examiner* — Peter G Leigh

(57) ABSTRACT

An electrical connector includes a housing holding wafer assemblies in a wafer stack each including a wafer body holding a leadframe with signal contacts arranged in pairs and extending between mating ends and mounting ends. Each pair includes a primary signal contact and a secondary signal contact. Each signal contact has a main body extending through the wafer bodies and a mating end extend from the wafer body presented at the mating interface. The mating ends are twisted 45° relative to the main bodies. The mating end of the primary signal contact is arranged at a first side of the main body and the mating end of the secondary signal contact is arranged at a second side of the main body to define a twisted pair interface configured to be mated with the mating signal contacts of the mating electrical connector.

20 Claims, 12 Drawing Sheets

ID $ 1

DIRECT PLUG ORTHOGONAL BOARD TO BOARD CONNECTOR SYSTEM

BACKGROUND OF THE INVENTION

The subject matter herein relates generally to electrical connectors for a communication system.

Communication systems use electrical connectors to electrically connect various components to allow data communication between the components. For example, in a direct plug orthogonal system, electrical connectors of circuit board assemblies are directly mated together with the circuit boards oriented perpendicular to each other. The signal conductors of the two electrical connectors transition between the two, perpendicular circuit boards. For high speed connectors, shielding is required, adding to the complexity of the connector designs. Typically, both connectors are designed differently to transition from the respective circuit boards. The design and manufacture of such systems are expensive because it requires tooling investments for two individual right angle connector designs. Some systems use a third adapter connector between the first and second connectors adding additional expense to the system.

A need remains for a cost effective and reliable electrical connector for a direct plug orthogonal system.

BRIEF DESCRIPTION OF THE INVENTION

In one embodiment, an electrical connector is provided and includes a housing that has a mating interface configured to be mated with a mating electrical connector. The electrical connector includes wafer assemblies that are coupled to the housing and arranged in a wafer stack. Each wafer assembly includes a leadframe and a wafer body that holds the leadframe. The leadframe has signal contacts extending between mating ends and mounting ends. The signal contacts are arranged in pairs. Each pair includes a primary signal contact of the signal contacts and a secondary signal contact of the signal contacts. The signal contacts have main bodies between the mating ends and the mounting ends. The main bodies extend through the wafer bodies. The mating ends extend from the wafer body and is presented at the mating interface of the housing for mating with mating signal contacts of the mating electrical connector. The mating ends are twisted at an angle relative to the main bodies, wherein the mating end of the primary signal contact is arranged at a first side of the corresponding main body and the mating end of the secondary signal contact is arranged at a second side of the corresponding main body to define a twisted pair interface configured to be mated with the mating signal contacts of the mating electrical connector.

In another embodiment, an electrical connector is provided and includes a housing having a mating interface configured to be mated with a mating electrical connector. The electrical connector includes wafer assemblies that are coupled to the housing and arranged in a wafer stack. Each wafer assembly includes a leadframe, a wafer body holding the leadframe, and a ground frame coupled to the wafer body to provide electrical shielding for the leadframe. Each leadframe has signal contacts extending between mating ends and mounting ends. The signal contacts are arranged in pairs. Each pair includes a primary signal contact of the signal contacts and a secondary signal contact of the signal contacts. The signal contacts have main bodies between the mating ends and the mounting ends. The main bodies extend through the wafer bodies. The mating ends extend from the wafer body and are presented at the mating interface of the housing for mating with mating signal contacts of the mating electrical connector. The mating ends are twisted 45° relative to the main bodies, wherein the mating end of the primary signal contact is arranged at a first side of the corresponding main body and the mating end of the secondary signal contact is arranged at a second side of the corresponding main body to define a twisted pair interface that is configured to be mated with the mating signal contacts of the mating electrical connector. Each ground frame having a ground plate coupled to the wafer body and ground shields extending forward from the ground plate. The ground shields extend along the mating ends of the corresponding pair of signal contacts to provide shielding for the mating ends of the corresponding pair of signal contacts. The ground shields are twisted 45° relative to the ground plate to define twisted shield zones along the mating ends of the signal contacts.

In a further embodiment, a communication system is provided and includes a first circuit board assembly having a first circuit board and a first electrical connector mounted to the first circuit board. The first electrical connector has primary signal contacts. The primary signal contacts are arranged in pairs. The primary signal contacts have main bodies between the mating ends and the mounting ends. The mating ends of the primary signal contacts are twisted 45° relative to the main bodies, wherein the mating ends of the primary signal contacts of each pair are arranged on opposite sides of the main bodies to define a first twisted pair interface. The communication system includes a second circuit board assembly having a second circuit board and a second electrical connector mounted to the second circuit board. The second electrical connector has secondary signal contacts. The secondary signal contacts are arranged in pairs. The secondary signal contacts have main bodies between the mating ends and the mounting ends. The mating ends of the secondary signal contacts are twisted 45° relative to the main bodies, wherein the mating ends of the secondary signal contacts of each pair are arranged on opposite sides of the main bodies to define a second twisted pair interface. The second twisted pair interface are configured to mate with the corresponding first twisted pair interface. The first and second electrical connectors are identical to each other. Each has a hermaphroditic mating interface defined by the first and secondary signal contacts. The first and second electrical connectors are mated such that the first circuit board is oriented perpendicular to the second circuit board.

DETAILED DESCRIPTION OF THE INVENTION

Figure 1:
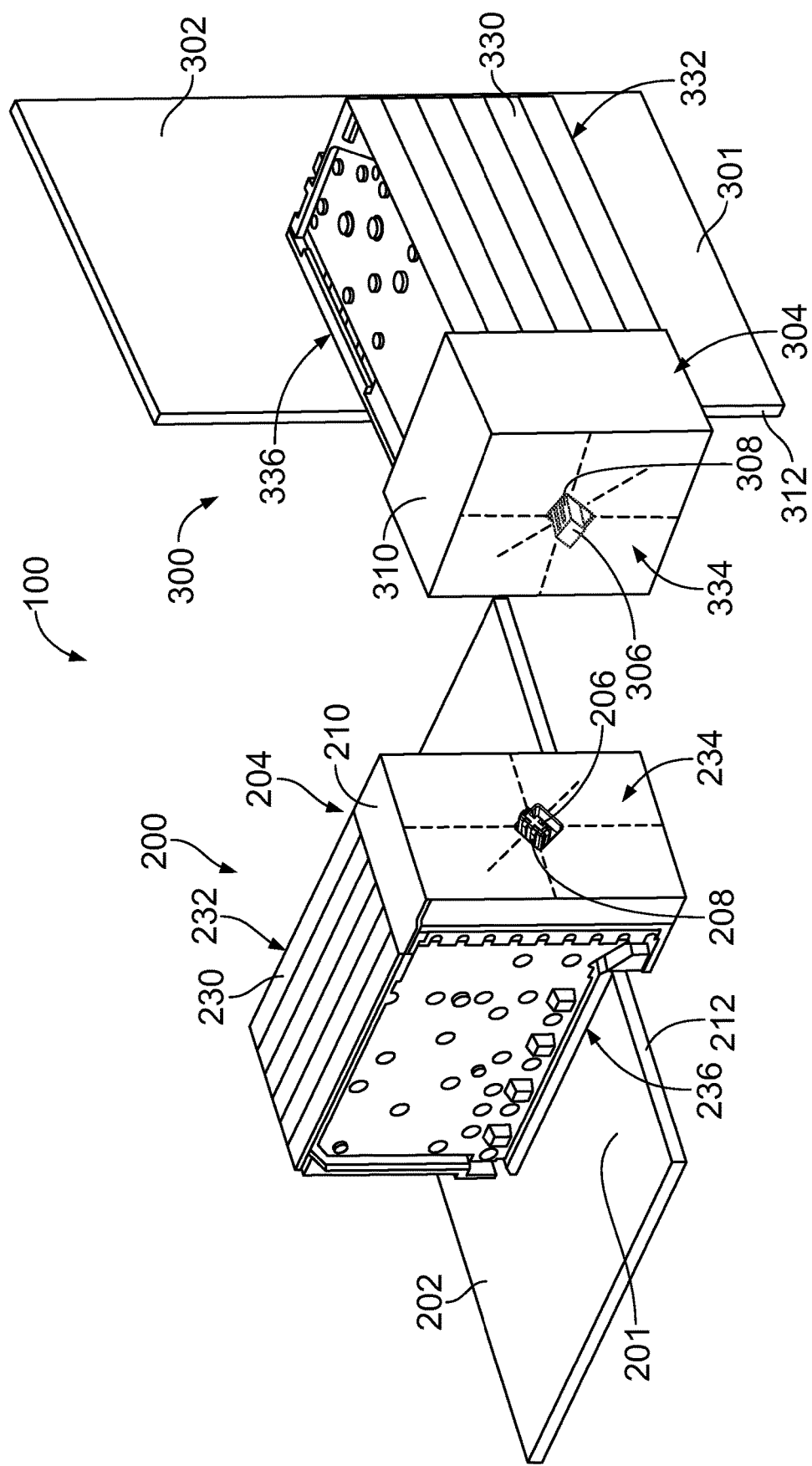
FIG. 1 illustrates a communication system in accordance with an exemplary embodiment.

FIG. 1 illustrates a communication system 100 in accordance with an exemplary embodiment. The communication system 100 includes a first circuit board assembly 200 and the second circuit board assembly 300 configured to be electrically coupled together. In various embodiments, the communication system 100 may be a server or network switch. In other various embodiments, the communication system 100 may be a backplane system. The first circuit board assembly 200 and/or the second circuit board assembly 300 may be a backplane assembly. The first circuit board assembly 200 and/or the second circuit board assembly 300 may be a daughtercard assembly. The first circuit board assembly 200 and/or the second circuit board assembly 300 may be a motherboard assembly.

In an exemplary embodiment, the first and second circuit board assemblies 200, 300 are directly mated together. For example, the first circuit board assembly 200 may be plugged into the second circuit board assembly 300 and/or the second circuit board assembly 300 may be plugged into the first circuit board assembly 200. The first and second circuit board assemblies 200, 300 are mated at a separable mating interface. The first and second circuit board assemblies 200, 300 are directly mated together without the use of an adapter or additional electrical connector therebetween.

The first circuit board assembly 200 includes a first circuit board 202 and a first electrical connector 204 mounted to the first circuit board 202. The first electrical connector 204 includes first signal contacts 206 and first ground shields 208 providing electrical shielding for the first signal contacts 206. FIG. 1 illustrates a single pair of the first signal contacts 206 and a single first ground shield 208; however, the first electrical connector 204 may include multiple pairs/shields, such as arranged in rows and columns.

The second circuit board assembly 300 includes a second circuit board 302 and a second electrical connector 304 mounted to the second circuit board 302. The second electrical connector 304 includes second signal contacts 306 and second ground shields 308 providing electrical shielding for the second signal contacts 306. FIG. 1 illustrates a single pair of the second signal contacts 306 and a single second ground shield 308; however, the second electrical connector 304 may include multiple pairs/shields, such as arranged in rows and columns.

The first and second electrical connectors 204, 304 have a hermaphroditic mating interface defined, at least in part, by the signal contacts 206, 306 and the ground shields 208, 308. The first and second electrical connectors 204, 304 are generally identical to each other, allowing use of same parts in both electrical connectors 204, 304, which reduces the overall cost of the communication system 100, such as a reduction in tooling costs to manufacture the parts. In an exemplary embodiment, the signal contacts 206, 306 are twisted 45° and the ground shields 208, 308 are twisted 45° to form the identical, hermaphroditic mating interfaces. Twisting the signal contacts 206, 306 and the ground shields 208, 308 allows the electrical connectors 204, 304 to be oriented at right angles relative to each other. In an exemplary embodiment, the communication system 100 is a direct plug orthogonal communication system. In the direct plug orthogonal communication system, the first circuit board 202 is oriented orthogonal or perpendicular to the second circuit board 302.

The signal contacts 206, 306 define electrical paths between the circuit boards 202, 302. The signal contacts 206, 306 both have twisted mating interfaces that mate at the separable mating interface between the first and second electrical connectors 204, 304. The 45° twists in the signal contacts 206, 306 combine to form the 90° transition between the circuit boards 202, 302 and allow the electrical connectors 204, 304 to be at right angles relative to each other. In an exemplary embodiment, the ground shields 208, 308 also include 45° twists to provide twisted shield zones along the mating ends of the signal contacts 206, 306. The twisted shield zones provide uniform shielding for the signal contacts 206, 306 as the signal contacts 206, 306 form the 90° transition between the electrical connectors 204, 304.

In an exemplary embodiment, the first electrical connector 204 is mounted to a mounting surface 201 of the first circuit board 202. The first electrical connector 204 may be mounted to the first circuit board 202 at or proximate to an edge 212 of the first circuit board 202. The first circuit board 202 has a first circuit board plane defined by the surface 201. The first electrical connector 204 extends outward from the surface 201. The mating interface of the first electrical connector 204 is oriented perpendicular to the surface 201.

For example, in various embodiments, the first circuit board 202 may be oriented horizontally and the mating interface of the first electrical connector 204 may be oriented vertically. Other orientations are possible in alternative embodiments.

The first electrical connector 204 includes a housing 210 having a mating interface configured to be mated with the second electrical connector 304. The mating interface is provided at a front of the housing 210. In an exemplary embodiment, the first electrical connector 204 includes a plurality of wafers assemblies 230 coupled to the housing 210. The wafer assemblies 230 include the signal contacts 206 and the ground shields 208. The wafer assemblies 230 are configured to be coupled to the first circuit board 202. For example, the signal contacts 206 may include compliant pins or press-fit pins configured to be press-fit into plated vias of the first circuit board 202. Alternatively, the signal contacts 206 may be soldered to solder pads of the first circuit board 202. In an exemplary embodiment, the wafer assemblies 230 are oriented perpendicular to the mounting surface 201 of the first circuit board 202. For example, the wafer assemblies 230 generally extend along wafer planes that are perpendicular to the circuit board plane of the first circuit board 202.

In an exemplary embodiment, the wafer assemblies 230 are arranged in a wafer stack 232. For example, the wafer assemblies 230 are parallel to each other in the wafer stack 232. The wafer stack 232 extends from a rear of the housing 210. Optionally, the wafer assemblies 230 may be individually loaded into the housing 210, such as into a cavity at a rear of the housing 210. Alternatively, the wafer assemblies 230 may be assembled together in the wafer stack 232 and the wafer stack 232 is loaded into the rear of the housing 210.

In an exemplary embodiment, each wafer assembly 230 extends between a mating end 234 and a mounting end 236. The mounting end 236 is configured to be mounted to the first circuit board 202. The mating end 234 extends into the housing 210 and is configured to be mated with the second electrical connector 304. The signal contacts 206 transition between the mounting end 236 and the mating end 234. In an exemplary embodiment, the wafer assembly 230 is a right-angle wafer assembly having the mating end 234 at a right angle relative to the mounting end 236. For example, the mounting end 236 may be at a bottom of the wafer assembly 230 and the mating end 234 may be at a front of the wafer assembly 230. The ground shields 208 are provided at the mating end 234 and are configured to be mated with the second ground shields 308. In an exemplary embodiment, the signal contacts 206 and the ground shields 208 are twisted 45° at the mating end 234 for mating with the second electrical connector 304.

In an exemplary embodiment, the second electrical connector 304 is mounted to a mounting surface 301 of the second circuit board 302. The second electrical connector 304 may be mounted to the second circuit board 302 at or proximate to an edge 312 of the second circuit board 302. The second circuit board 302 has a second circuit board plane defined by the surface. The second electrical connector 304 extends outward from the surface. The mating interface of the second electrical connector 304 is oriented perpendicular to the surface 301.

The second electrical connector 304 includes a housing 310 having a mating interface configured to be mated with the first electrical connector 204. The mating interface is provided at a front of the housing 310. In an exemplary embodiment, the second electrical connector 304 includes a plurality of wafers assemblies 330 coupled to the housing 310. The wafer assemblies 330 include the signal contacts 306 and the ground shields 308. The wafer assemblies 330 are configured to be coupled to the second circuit board 302. For example, the signal contacts 306 may include compliant pins or press-fit pins configured to be press-fit into plated vias of the second circuit board 302. Alternatively, the signal contacts 306 may be soldered to solder pads of the second circuit board 302. In an exemplary embodiment, the wafer assemblies 330 are oriented perpendicular to the mounting surface of the second circuit board 302. For example, the wafer assemblies 330 generally extend along wafer planes that are perpendicular to the circuit board plane of the second circuit board 302.

In an exemplary embodiment, the wafer assemblies 330 are arranged in a wafer stack 332. For example, the wafer assemblies 330 are parallel to each other in the wafer stack 332. The wafer stack 332 extends from a rear of the housing 310. Optionally, the wafer assemblies 330 may be individually loaded into the housing 310, such as into a cavity at a rear of the housing 310. Alternatively, the wafer assemblies 330 may be assembled together in the wafer stack 332 and the wafer stack 332 is loaded into the rear of the housing 310.

In an exemplary embodiment, each wafer assembly 330 extends between a mating end 334 and a mounting end 336. The mounting end 336 is configured to be mounted to the second circuit board 302. The mating end 334 extends into the housing 310 is configured to be mated with the first electrical connector 204. The signal contacts 306 transition between the mounting end 336 and the mating end 334. In an exemplary embodiment, the wafer assembly 330 is a right-angle wafer assembly having the mating end 334 at a right angle relative to the mounting end 336. For example, the mounting end 336 may be at a bottom of the wafer assembly 330 and the mating end 334 may be at a front of the wafer assembly 330. The ground shields 308 are provided at the mating end 334 and are configured to be electrically connected with the first ground shields 208. In an exemplary embodiment, the signal contacts 306 and the ground shields 308 are twisted 45° at the mating end 334 for mating with the first electrical connector 204.

Figure 2:
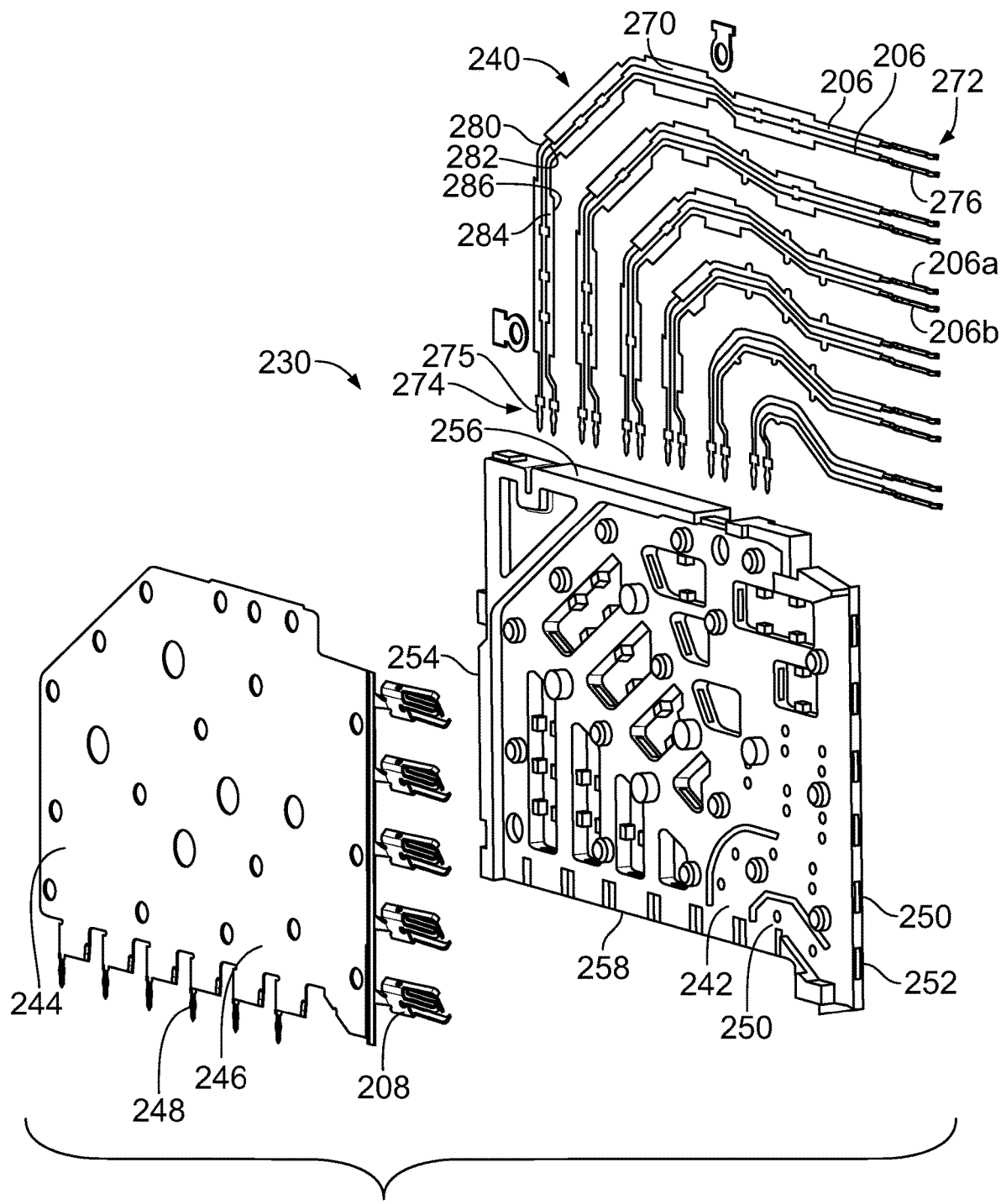
FIG. 2 is an exploded view of the wafer assembly in accordance with an exemplary embodiment.

FIG. 2 is an exploded view of the wafer assembly 230 in accordance with an exemplary embodiment. In an exemplary embodiment, the wafer assembly 230 is identical to the wafer assembly 330 (shown in FIG. 1) with both wafer assemblies 230, 330 including identical components.

The wafer assembly 230 includes a leadframe 240, a wafer body 242 holding the leadframe 240, and a ground frame 244 coupled to the wafer body 242 to provide electrical shielding for the leadframe 240. The leadframe 240 includes the signal contacts 206. The leadframe 240 may be stamped and formed from a metal sheet. In an exemplary embodiment, the leadframe 240 only includes the signal contacts 206. However, in alternative embodiments, the leadframe 240 may include ground contacts arranged between corresponding signal contacts to provide electrical shielding for the signal contacts. In an exemplary embodiment, the signal contacts 206 are arranged in pairs configured to carry differential signals. However, the signal contacts 206 may be single ended signal contacts in alternative embodiments.

The wafer body 242 surrounds the signal contacts 206 and positions the signal contacts 206 relative to each other. In an exemplary embodiment, the wafer body 242 is manufactured from a dielectric material, such as a plastic material. In an exemplary embodiment, the wafer body 242 is an overmold that is overmolded around the leadframe 240. The wafer body 242 includes sides 250 extending between a front 252 and a rear 254 and extending between a top 256 and a bottom 258. The bottom 258 defines a mounting end and the front 252 defines a mating end. The signal contacts 206 extend from the wafer body 242 at the bottom 258 for connection to the circuit board 202 (shown in FIG. 1). The signal contacts 206 extend from the wafer body 242 at the front 252 for connection to the second electrical connector 304 (shown in FIG. 1). In an exemplary embodiment, the signal contacts 206 are twisted 45° forward of the wafer body 242 for mating with the second electrical connector 304.

The ground frame 244 provides a shield structure for the signal contacts 206. In an exemplary embodiment, the ground frame 244 includes a ground plate 246 forming a main body of the ground frame 244. The ground shields 208 extend from the ground plate 246, such as a front of the ground plate 246. The ground shields 208 are twisted 45° forward of the ground plate 246 for mating with the second electrical connector 304. The ground plate 246 is configured to be coupled to one of the sides 250 of the wafer body 242. In an exemplary embodiment, the ground plate 246 is generally planar. The ground frame 244 includes pins 248 extending from the bottom of the ground plate 246. The pins 248 are configured to be coupled to the first circuit board 202. For example, the pins 248 may be compliant pins configured to be press-fit into plated vias of the first circuit board 202 to electrically connect the ground frame 244 to a ground plane of the first circuit board 202. Optionally, the wafer assembly 230 may include ground frames 244 on each side of the wafer body 242. One or both of the ground frames 244 may include the ground shields 208. The ground frames 244 may be connected to each other through the wafer body 242, such as using grounding tabs. In some embodiments, multiple ground frames 244 may be provided at the same side, such as stacked at the side of the wafer body 242, wherein each ground frame includes a subset of the ground shields 208.

Each signal contact 206 includes a main body 270 extending between a mating end 272 and a mounting end 274. In the illustrated embodiment, the signal contact 206 is a right-angle contact with the main body 270 extending through a generally 90° transition between the mating end 272 and the mounting end 274. The mating end 272 is generally perpendicular to the mounting end 274. In an exemplary embodiment, the main body 270 is stamped and formed as part of the leadframe 240. When stamped, the main body 270 has first and second edges 280, 282 extending between first and second sides 284, 286. The edges 280, 282 are the cut edges made during the stamping process. The sides 284, 286 are the main, opposed surfaces of the metal sheet from which the signal contact 206 is stamped. The main bodies 270 of the leadframe 240 are arranged in a leadframe plane parallel to the sides 284, 286.

The signal contact 206 includes a spring beam 276 at the mating end 272 and a pin 275 at the mounting end 274. The spring beam 276 is deflectable and configured to be mated with a corresponding spring beam of the second signal contact 306 (shown in FIG. 1). In an exemplary embodiment, the spring beams 276 of the pair are jogged in opposite directions. For example, the spring beam 276 of a primary signal contact 206a is jogged in a first direction to the first side of the main body 270 and the spring beam of a secondary signal contact 206b is jogged in a second direction to the second side of the main body 270. The mating end 272 (for example, the spring beam 276 at the mating end 272) is twisted 45° relative to the main body 270 for mating with the second signal contact 306. For example, the spring beam 276 is twisted such that the mating end 272 is offset or angled 45° relative to the leadframe plane. The spring beam 276 at the mating end 272 may be jogged to an offset position at a side of the leadframe plane defined by the main body 270. The mating ends 272 of the signal contacts 206 are shown in further detail in FIGS. 3-6.

Figure 3:
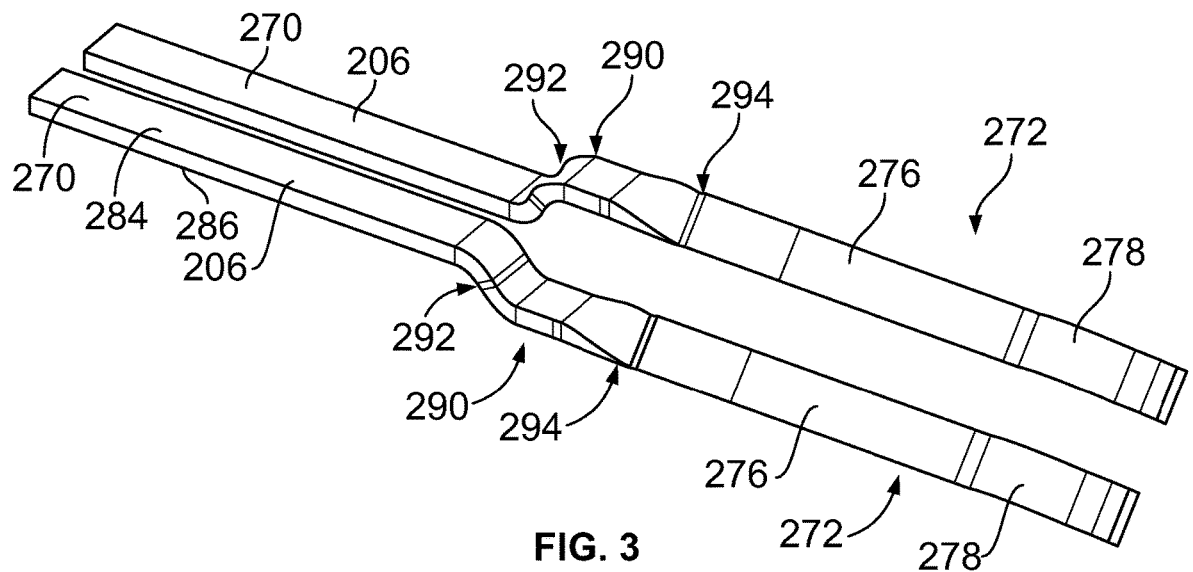
FIG. 3 is a perspective view of the spring beams at the mating ends of a pair of the signal contacts in accordance with an exemplary embodiment (the wafer body is removed for clarity).
Figure 4:
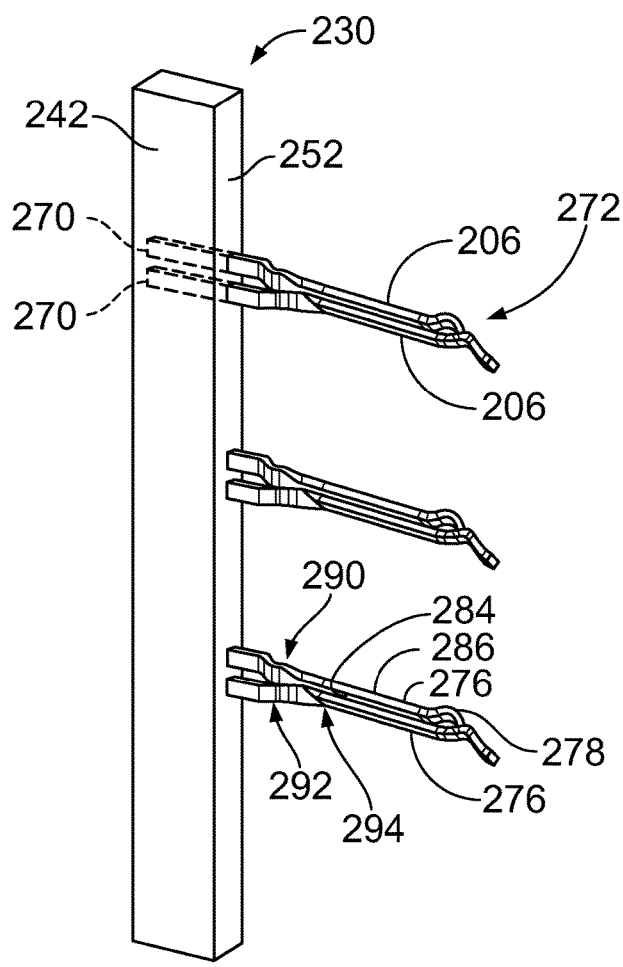
FIG. 4 is a perspective view of a portion of the wafer assembly in accordance with an exemplary embodiment showing pairs of the signal contacts arranged along the front of the wafer body taken from a first side.
Figure 5:
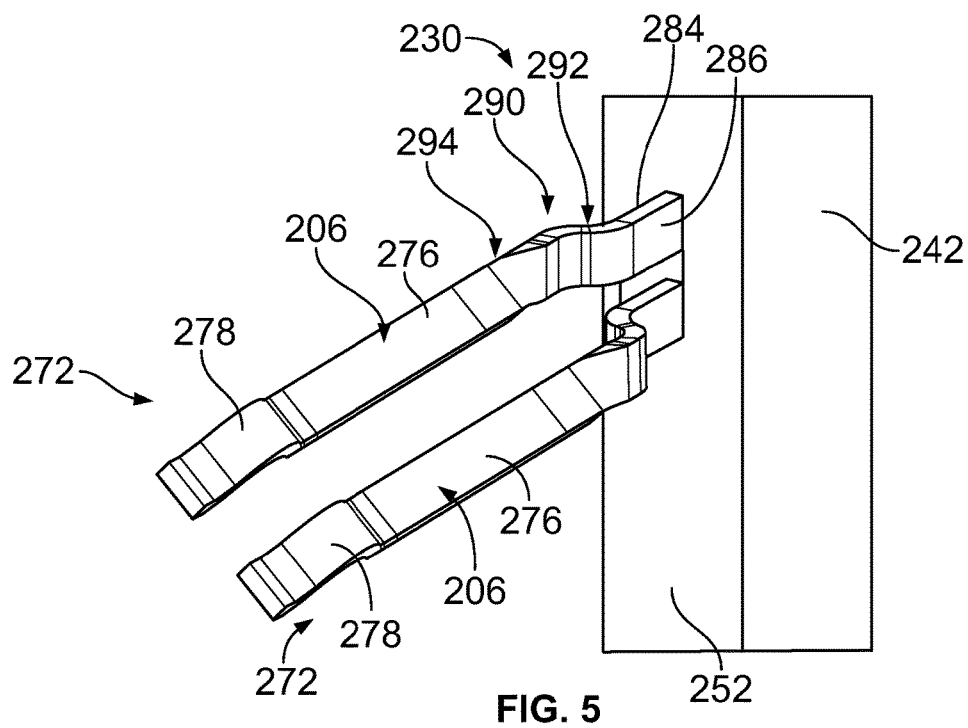
FIG. 5 is a perspective view of a portion of the wafer assembly in accordance with an exemplary embodiment showing one pair of the signal contacts taken from a second side of the wafer body.
Figure 6:
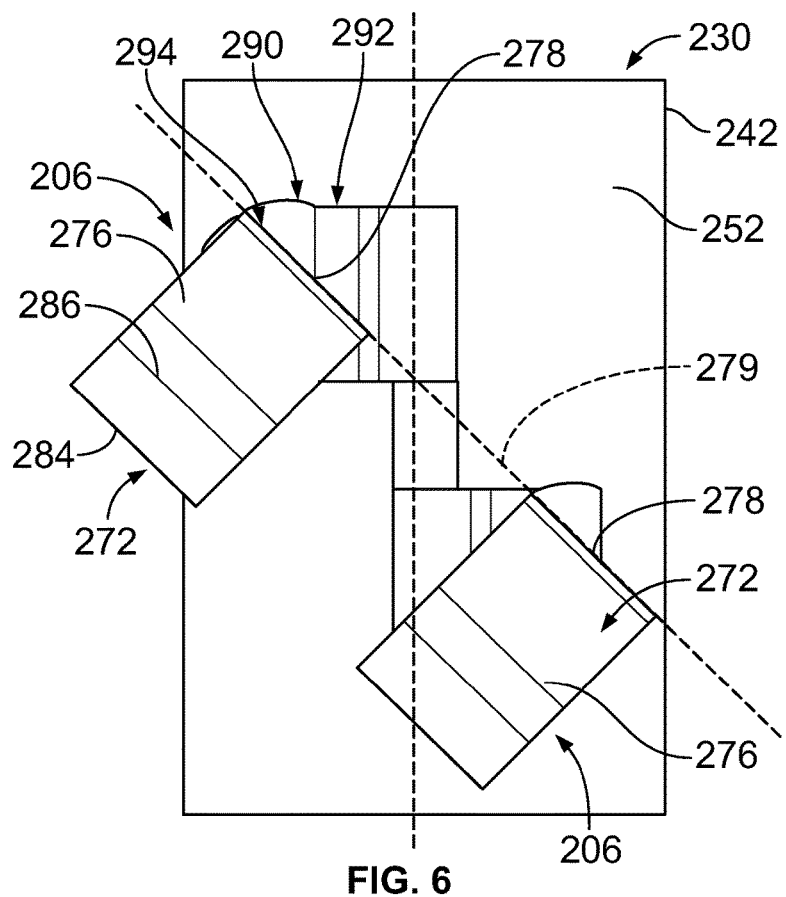
FIG. 6 is a front view of a portion of the wafer assembly in accordance with an exemplary embodiment showing one pair of the signal contacts.

FIG. 3 is a perspective view of the spring beams 276 at the mating ends 272 of a pair of the signal contacts 206 in accordance with an exemplary embodiment (the wafer body 242 is removed for clarity). FIG. 4 is a perspective view of a portion of the wafer assembly 230 in accordance with an exemplary embodiment showing pairs of the signal contacts 206 arranged along the front of the wafer body 242 taken from a first side. FIG. 5 is a perspective view of a portion of the wafer assembly 230 in accordance with an exemplary embodiment showing one pair of the signal contacts 206 taken from a second side of the wafer body 242. FIG. 6 is a front view of a portion of the wafer assembly 230 in accordance with an exemplary embodiment showing one pair of the signal contacts 206.

The main bodies 270 of the signal contacts 206 are configured to extend through the wafer body 242, generally along a plane, referred to as a main body plane or a leadframe plane. The mating ends 272 extend from the front 252 of the wafer body 242 (for example, the mating end 272 is defined as the portion of the signal contact 206 exposed forward of the wafer body 242). Each mating end 272 includes a transition portion 290 at a root of the mating end 272. The transition portion 290 extends from the main body 270 to the spring beam 276. The spring beam 276 includes a mating finger 278 at or near a tip of the mating end 272. The spring beam 276 extends between the transition portion 290 and the mating finger 278. In the illustrated embodiment, the mating finger 278 includes a bump defining a mating interface of the mating end 272. The mating finger 278 may have other shapes in alternative embodiments.

The transition portion 290 includes a jog portion 292 and a twist portion 294. In various embodiments, the jog portion 292 is located at the root of the mating end 272 and the twist portion 294 is located between the jog portion 292 and the spring beam 276. Alternatively, the twist portion 294 is located at the root of the mating end 272 and the jog portion 292 is located between the twist portion 294 and the spring beam 276. In other various embodiments, the jog portion 292 and the twist portion 284 may be coincident, occurring along the same section of the mating end 272.

The jog portion 292 shifts or jogs the mating end 272 out of plane relative to the leadframe plane. For example, the jog portion 292 jogs the mating end 272 to the first side 284 or the second side 286 of the main body 270. In an exemplary embodiment, one of the mating ends 272 of the pair is jogged to the first side 284, while the other mating end 272 is jogged to the second side 286. As such, the mating ends 272 are spread apart from each other (for example, in a side-to-side direction). The jog portion 292 includes one or more bends, such as two approximately 90° bends. The jog portion 292 may have other bends or an alternative shape in alternative embodiments.

The twist portion 294 rotates the mating end 272 out of plane relative to the leadframe plane. In an exemplary embodiment, the twist portion 294 orients the spring beam 276 at 45° relative to the leadframe plane. For example, the sides 284, 286 along the mating end 272 are angled 45° relative to the sides 284, 286 along the main body 270. In an exemplary embodiment, within each differential pair the first sides 284 of the each of the signal contacts 206 are coplanar and the second sides 286 of each of the signal contacts 206 are coplanar. The mating interfaces defined by the mating fingers 278 are coplanar (FIG. 6) along a mating plane 279 that is oriented at 45° relative to the leadframe plane. The first sides 284 along the mating ends 272 are oriented at 45° relative to the first sides 284 along the main bodies 270 and the second sides 286 along the mating ends 272 are oriented at 45° relative to the second sides 286 along the main bodies 270. In an exemplary embodiment, the mating ends 272 of the signal contacts 206 within each pair are transitioned in different directions. For example, the mating ends 272 of the signal contacts 206 are jogged and twisted such that one of the signal contacts 206 of the pair is on a right side of the leadframe plane and the other signal contacts 206 of the pair is on a left side of the leadframe plane.

Figure 7:
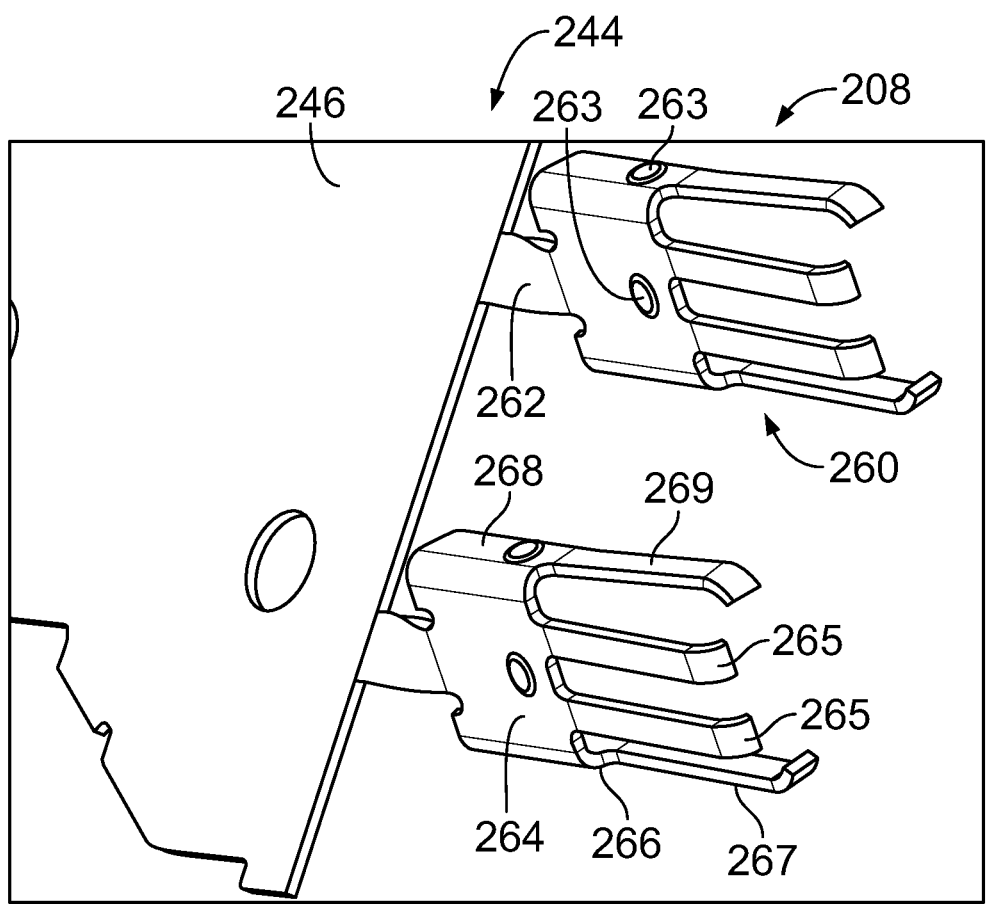
FIG. 7 is a perspective view of a portion of the wafer assembly in accordance with an exemplary embodiment showing a ground shield.

FIG. 7 is a perspective view of a portion of the ground frame 244 in accordance with an exemplary embodiment. FIG. 7 illustrates a plurality of the ground shields 208 extending from the front of the ground plate 246. Each ground shield 208 includes a shield portion 260 and a transition portion 262 between the shield portion 260 and the ground plate 246. The shield portion 260 provides electrical shielding along the mating ends 272 (shown in FIG. 3) of the signal contacts 206 (shown in FIG. 3). The transition portion 262 includes a twist to orient the shield portion 260 at 45° relative to the ground plate 246. As such, the shield portion 260 is oriented complimentary to the mating ends 272 of the corresponding signal contacts 206. The shield portion 260 provides efficient shielding for the signal contacts 206 because both the shield portion 260 and the mating ends 272 are twisted 45°.

In the illustrated embodiment, the shield portion 260 of the ground shield 208 is C-shaped. The shield portion 260 includes an end wall 264 and side walls 266, 268 extending from the end wall 264. The transition portion 262 is connected to the end wall 264. The transition portion 262 is twisted such that the end wall 264 is angled at 45° relative to the ground plate 246. The twist axis is aligned with the ground plate 246 such that part of the end wall 264 is shifted to the right side of the ground plate 246 and part of the end wall 264 is shifted to the left side of the ground plate 246. The first side wall 266 is located at the right side of the ground plate 246 and the second side wall 266 is located at the left side of the ground plate 246. In an exemplary embodiment, the shield portion 260 is stamped such that the end wall 264 includes one or more ground fingers 265 and such that the side walls 266, 268 include one or more ground fingers 267, 269, respectively. The ground fingers 265, 267, 269 include mating interfaces. For example, the ground fingers 265, 267, 269 may be cupped or include bumps near distal ends of the ground fingers 265, 267, 269. The ground fingers 265, 267, 269 are deflectable. Optionally, the end wall 264 and/or the side walls 266, 268 may include dimples 263.

Figure 8:
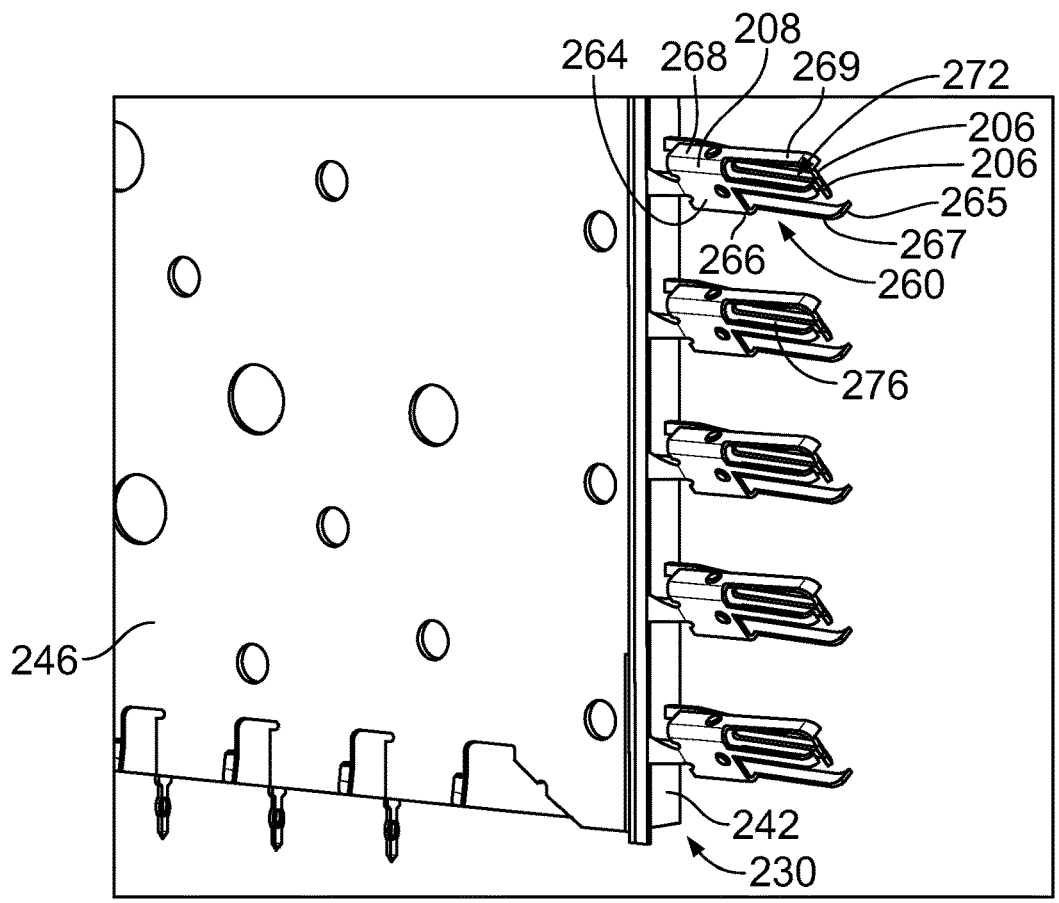
FIG. 8 is a side perspective view of a portion of the wafer assembly in accordance with an exemplary embodiment.
Figure 9:
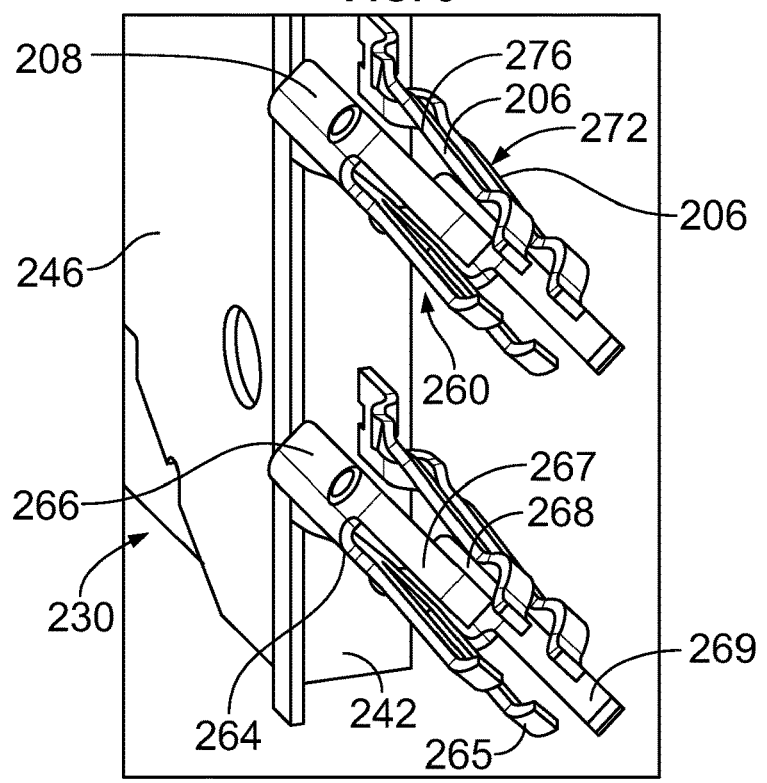
FIG. 9 is a front perspective view of a portion of the wafer assembly in accordance with an exemplary embodiment.

FIG. 8 is a side perspective view of a portion of the wafer assembly 230 in accordance with an exemplary embodiment. FIG. 9 is a front perspective view of a portion of the wafer assembly 230 in accordance with an exemplary embodiment. FIGS. 8 and 9 illustrate the ground shields 208 and the mating ends 272 of the signal contacts 206 twisted at 45°. The mating ends 272 form twisted mating interfaces for mating with the second signal contacts 306 (shown in FIG. 1). The ground shields 208 form twisted shield zones for the mating ends 272.

The ground plate 246 extends along one side of the wafer body 242. However, in alternative embodiments, ground plates 246 may be provided along both sides of the wafer body 242. The ground shields 208 are positioned along the sides of the mating ends 272 of the signal contacts 206. The shield portions 260 provide shielding for the corresponding pair of signal contacts 206. By twisting both the signal contacts 206 and the ground shields 208, the ground shields 208 maintain generally uniform spacing relative to the signal contacts 206 along the signal paths (for example, along the mating ends 272 as well as along the main bodies 270). When twisted, the end wall 264 of the ground shield 208 is generally parallel to the mating ends 272 of the pair of signal contacts 206. The end wall 264 maintains generally uniform spacing from both spring beams 276 of the pair. The ground fingers 265 have generally uniform spacing from the spring beams 276 of the pair. The ground fingers 267, 269 of the side walls 266, 268 are spaced generally uniformly from the respective (closest) signal contact 206. The ground shields 208 provide efficient electrical shielding for both signal contacts 206 of the pair corresponding pairs.

Figure 10:
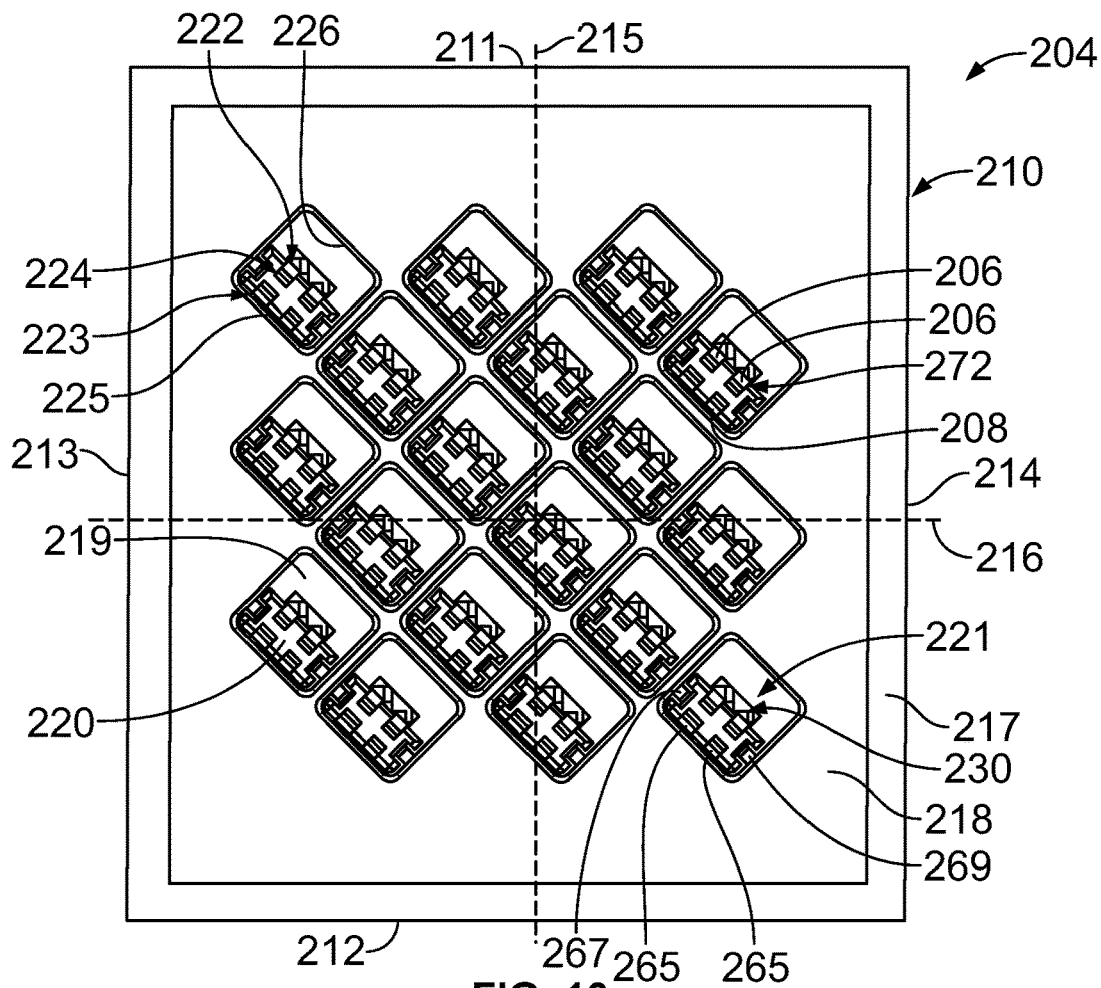
FIG. 10 is a front view of the first electrical connector in accordance with an exemplary embodiment.
Figure 11:
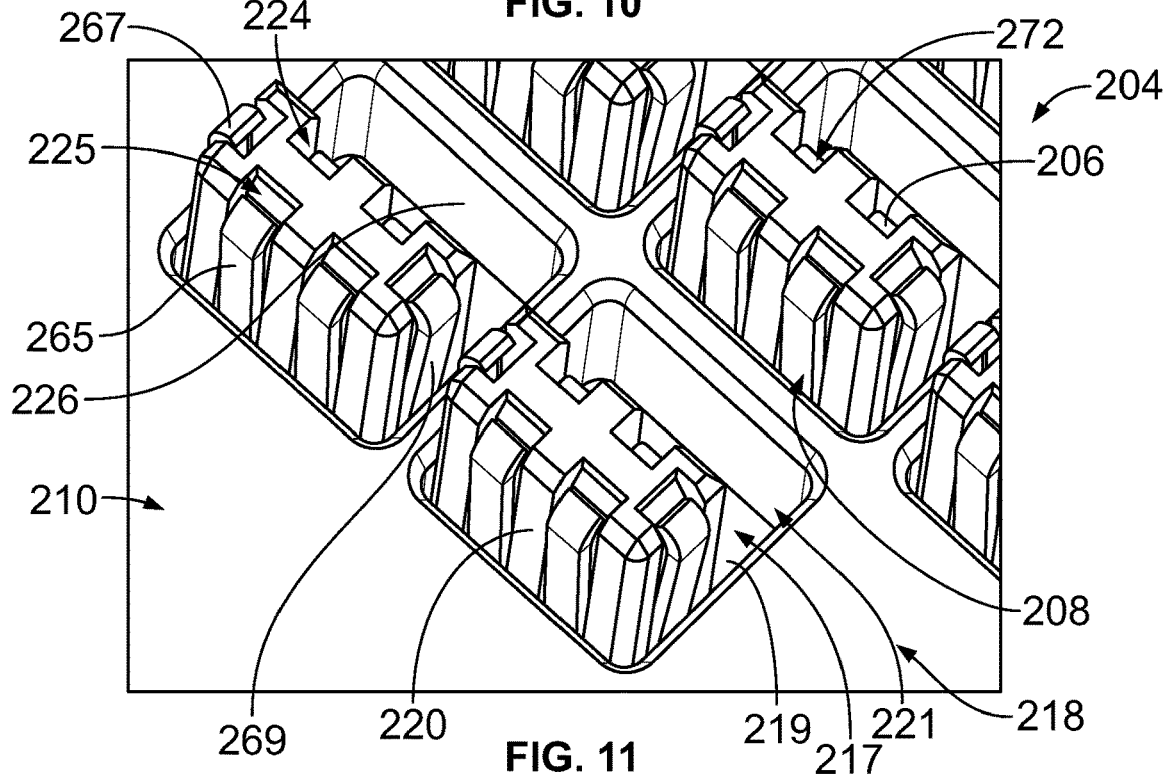
FIG. 11 is a front perspective view of a portion of the first electrical connector in accordance with an exemplary embodiment.

FIG. 10 is a front view of the first electrical connector 204 in accordance with an exemplary embodiment. FIG. 11 is a front perspective view of a portion of the first electrical connector 204 in accordance with an exemplary embodiment. The housing 210 holds the signal contacts 206 and the ground shields 208 for mating with the second electrical connector 304 (shown in FIG. 1). The housing 210 forms part of the mating interface with the second electrical connector 304.

The housing 210 has a top 211 and a bottom 212. The housing 210 includes a first side 213 and a second side 214 opposite the first side 213. The housing 210 has a primary axis 215 extending from top 211 to bottom 212 and a secondary axis 216 extending from the first side 213 to the second side 214. The secondary axis 216 is perpendicular to the primary axis 215. In an exemplary embodiment, the mating ends 272 of the signal contacts 206 and the ground shields 208 are oriented at 45° relative to the primary axis 215 and relative to the secondary axis 216. The wafer assemblies 230 are received in the housing 210 such that the wafer assemblies 230 are oriented parallel to the primary axis 215.

In an exemplary embodiment, the housing 210 is a multi-piece housing including a contact organizer 217 and a commoning member 218. The commoning member 218 is at the front of the housing 210, such as forward of the contact organizer 217. The contact organizer 217 may include locating features for locating the commoning member 218 relative to the contact organizer 217. In an exemplary embodiment, the commoning member 218 faces the second electrical connector 304. The commoning member 218 is electrically conductive and is used to electrically common the ground frames 244 (shown in FIG. 2) of each of the wafer assemblies 230. The commoning member 218 provides electrical shielding for the signal contacts 206 at the mating interface.

In an exemplary embodiment, the contact organizer 217 includes a base 219 in a plurality of towers 220 extending forward from the base 219. The towers 220 supports the signal contacts 206 and the ground shields 208. In an exemplary embodiment, the towers 220 extend into openings 221 in the commoning member 218. The towers 220 may pass entirely through the openings 221 and extend forward of the front of the commoning member 218. The towers 220 are configured to be received in corresponding openings in a commoning member of the second electrical connector 304. In an exemplary embodiment, the towers 220 are rectangular shaped; however, the towers 220 may have other shapes in alternative embodiments. The towers 220 are angled relative to the primary axis 215, such as at 45°.

The wafer assemblies 230 are coupled to the housing 210 rearward of the base 219. The signal contacts 206 and the ground shields 208 pass through the base 219 to extend along the towers 220. In an exemplary embodiment, the base 219 includes signal contact openings 222 and ground shield openings 223. The mating ends 272 of the signal contacts 206 extend through the signal contact openings 222. The mating ends 272 are received in signal contact pockets 224 of the towers 220. The signal contact pockets 224 locate the mating ends 272 relative to each other and relative to the ground shields 208. In an exemplary embodiment, the mating ends 272 are electrically isolated from each other and from the ground shields 208 by the dielectric material of the towers 220. The ground shields 208 extend through the ground shield openings 223 to the towers 220. The ground fingers 265, 267, 269 are received in ground finger pockets 225 of the towers 220. The ground finger pockets 225 locate the ground fingers 265, 267, 269 relative to each other and relative to the mating ends 272 of the signal contacts 206.

The commoning member 218 is manufactured from a conductive material. For example, the commoning member 218 may be a metal block having the openings 221 formed therethrough. In alternative embodiments, the commoning member 218 may be manufactured from a conductive plastic. In other various embodiments, the commoning member 218 may be a plated plastic structure having plating at the front and/or through the openings 221 and/or at the rear. The ground shields 208 are configured to be electrically connected to the commoning member 218. For example, the ground shields 208 may engage the commoning member 218 within the openings 221.

In an exemplary embodiment, the openings 221 pass entirely through the commoning member 218 and are defined by walls 226. In an exemplary embodiment, the openings 221 are rectangular. In the illustrated embodiment, the openings 221 are square shaped. However, the openings 221 may have other shapes. In alternative embodiments the openings 221 are oversized relative to the towers 220. For example, each opening 221 may be sized to receive two of the towers 220 (one from the first electrical connector 204 and one from the second electrical connector 304).

Figure 12:
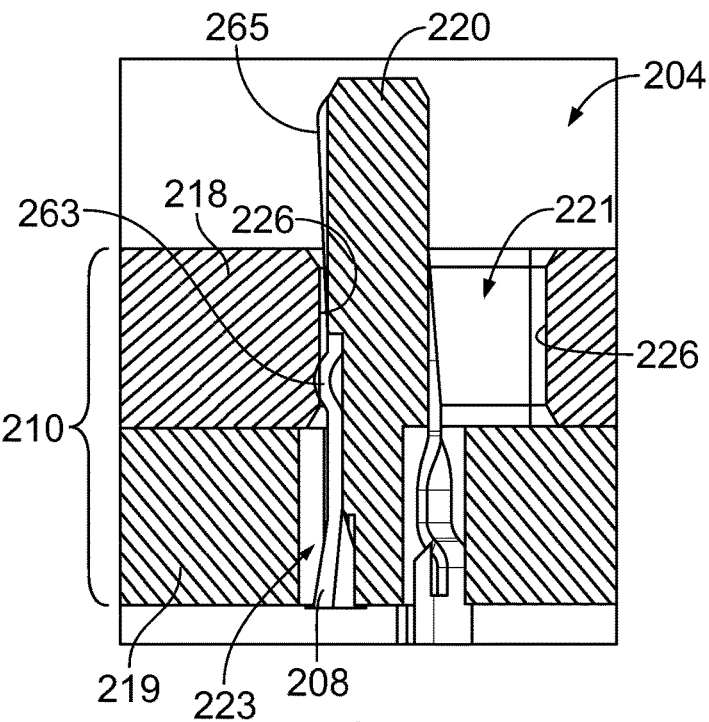
FIG. 12 is a cross-sectional view of a portion of the first electrical connector in accordance with an exemplary embodiment.

FIG. 12 is a cross-sectional view of a portion of the first electrical connector 204 in accordance with an exemplary embodiment. FIG. 12 illustrates one of the ground shields 208 received in the housing 210. The ground shield 208 is received in the ground shield opening 223 to pass through the base 219. The ground shield 208 extends along the tower 220. For example, the base and the ground fingers 265 extend along the tower 220. The tower 220 and the ground shield 208 extend into and through the opening 221 in the commoning member 218. In an exemplary embodiment, the dimple 263 engages the walls 226 within the opening 221 to electrically connect the ground shield 208 with the commoning member 218. The tower 220 engages or presses against the ground shield 208 to ensure electrical connection between the ground shield 208 and the commoning member 218.

Figure 13:
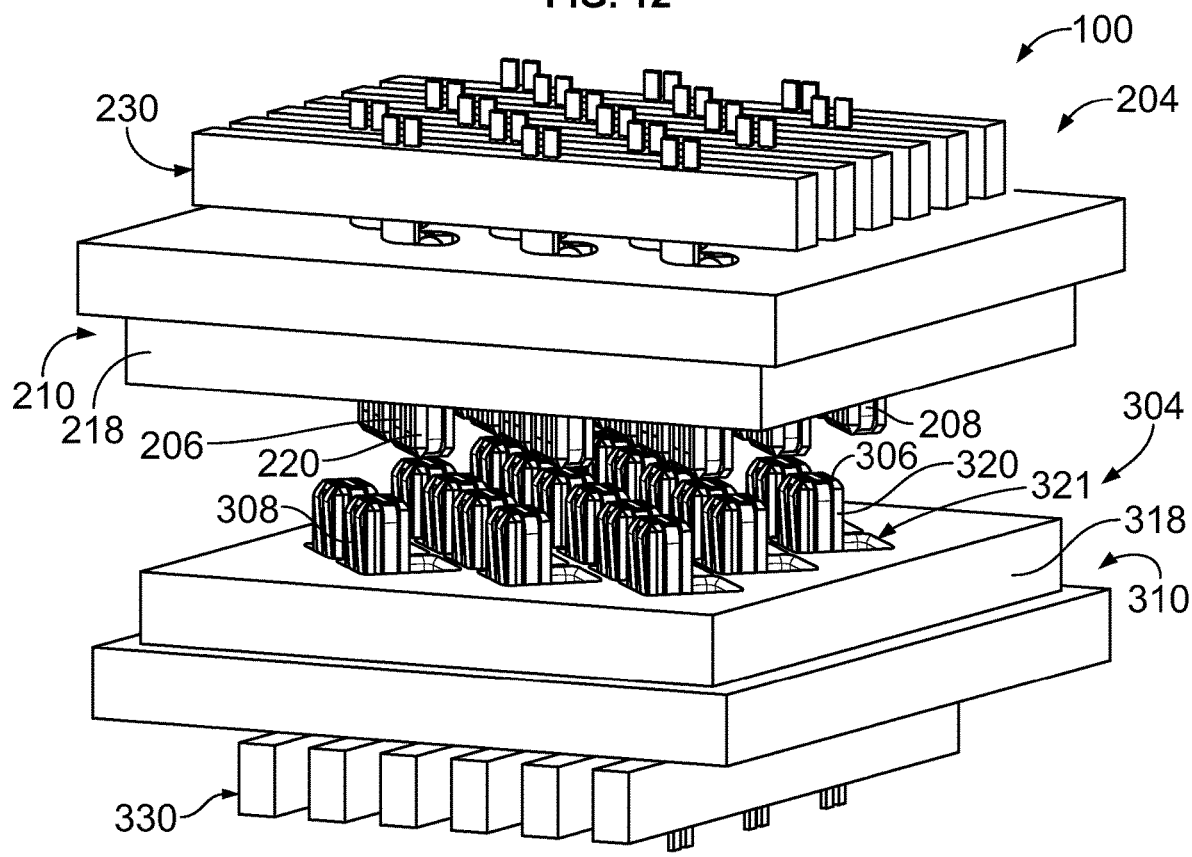
FIG. 13 illustrates a portion of the communication system showing the first electrical connector positioned for mating with the second electrical connector in an exemplary embodiment.

FIG. 13 illustrates a portion of the communication system 100 showing the first electrical connector 204 positioned for mating with the second electrical connector 304. In an exemplary embodiment, the mating interfaces of the first electrical connector 204 and the second electrical connector 304 are hermaphroditic and identical to each other. The signal contacts 206, 306 and the ground shields 208, 308 are each angled 45° to form an orthogonal mating interface.

At the mating interface, the towers 220 protrude forward from the housing 210, such as forward from the front of the commoning member 218. Similarly, towers 320 protrude forward from the housing 310 of the second electrical connector 304. The commoning member 218 faces a commoning member 318 of the second electrical connector 304. The first signal contacts 206 and the first ground shields 208 extend along the towers 220 of the first electrical connector 204. The towers 220 are aligned with openings 321 in the commoning member 318 of the second electrical connector 304. The towers 220 are configured to be received in the openings 321 in the commoning member 318 adjacent the towers 320 of the second electrical connector 304. The first signal contacts 206 and the first ground shields 208 are configured to be plugged into the openings 321 in the commoning member 318 with the towers 220. The first ground shields 208 are configured to be electrically connected to the commoning member 318 when the first ground shields 308 are plugged into the opening 321 in the commoning member 318.

The second signal contacts 306 and the second ground shields 308 extend along the towers 320 of the second electrical connector 304. The towers 320 are aligned with the openings 221 in the commoning member 218 of the first electrical connector 204. The towers 320 are configured to be received in the openings 221 in the commoning member 218 adjacent the towers 220 of the first electrical connector 204. The second signal contacts 306 and the second ground shields 308 are configured to be plugged into the openings 221 in the commoning member 218 with the towers 320. The second ground shields 308 are configured to be electrically connected to the commoning member 218 when the second ground shields 308 are plugged into the opening 221 in the commoning member 218. The ground shields 208, 308 do not directly mate with each other, but rather are electrically connected through the commoning members 218, 318.

When the electrical connectors 204, 304 are mated, the first signal contacts 206 are mated with the second signal contacts 306. The first signal contacts 206 transition 45° relative to the wafer assemblies 230 and the second signal contacts 306 transition 45° relative to corresponding wafer assemblies 330 of the second electrical connector 304. As such, the signal paths transition 90° from the first wafer assemblies 230 to the second wafer assemblies 330. The first and second ground shields 208, 308 provide shield zones along the mating ends of the signal contacts 206, 306. The first and second ground shields 208, 308 both transition 45° relative to the wafer assemblies 230, 330 to transition the shield zones with the mating ends of the signal contacts 206, 306. The ground shields 208, 308 provide electrical shielding through the shielded mating zone. Additionally, the first and second commoning members 218, 318 provide electrical shielding at the mating zone. Each of the first ground shields 208 are configured to be directly electrically connected to both the first and second commoning members 218, 318. Similarly, each of the second ground shields 308 are configured to be directly electrically connected to both the first and second commoning members 218, 318. The shielding continues through the mating zone and generally uniformly spaced from the signal contacts 206, 306 through the mating zone. The continuous, uniform shielding enhances electrical performance of the communication system 100. The shielding reduces crosstalk and reduces return loss along the signal paths. The shielding provides impedance control along the signal paths.

Figure 14:
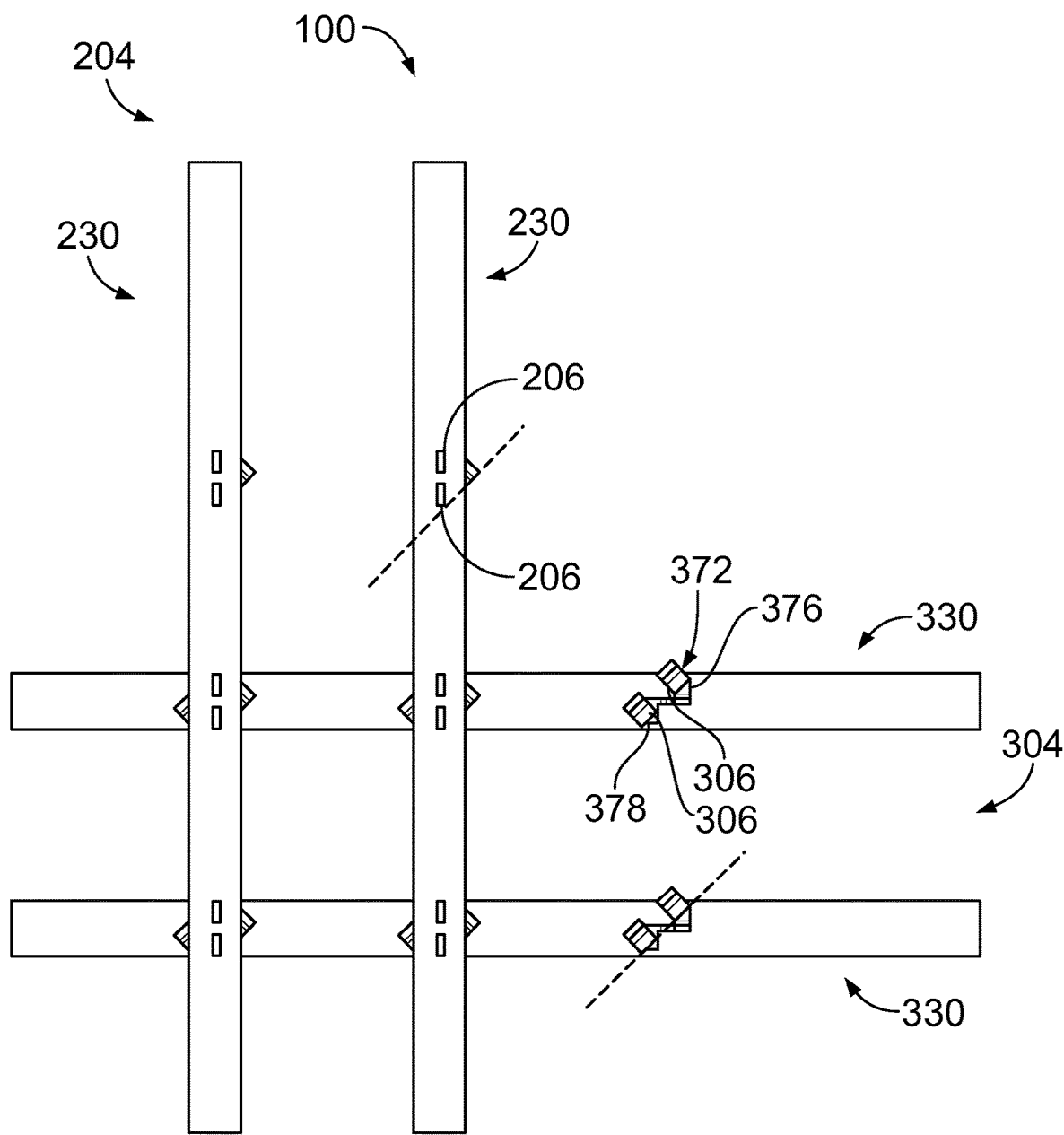
FIG. 14 is an end view of a portion of the communication system showing wafer assemblies of the first electrical connector mated with wafer assemblies of the second electrical connector in an exemplary embodiment.
Figure 15:
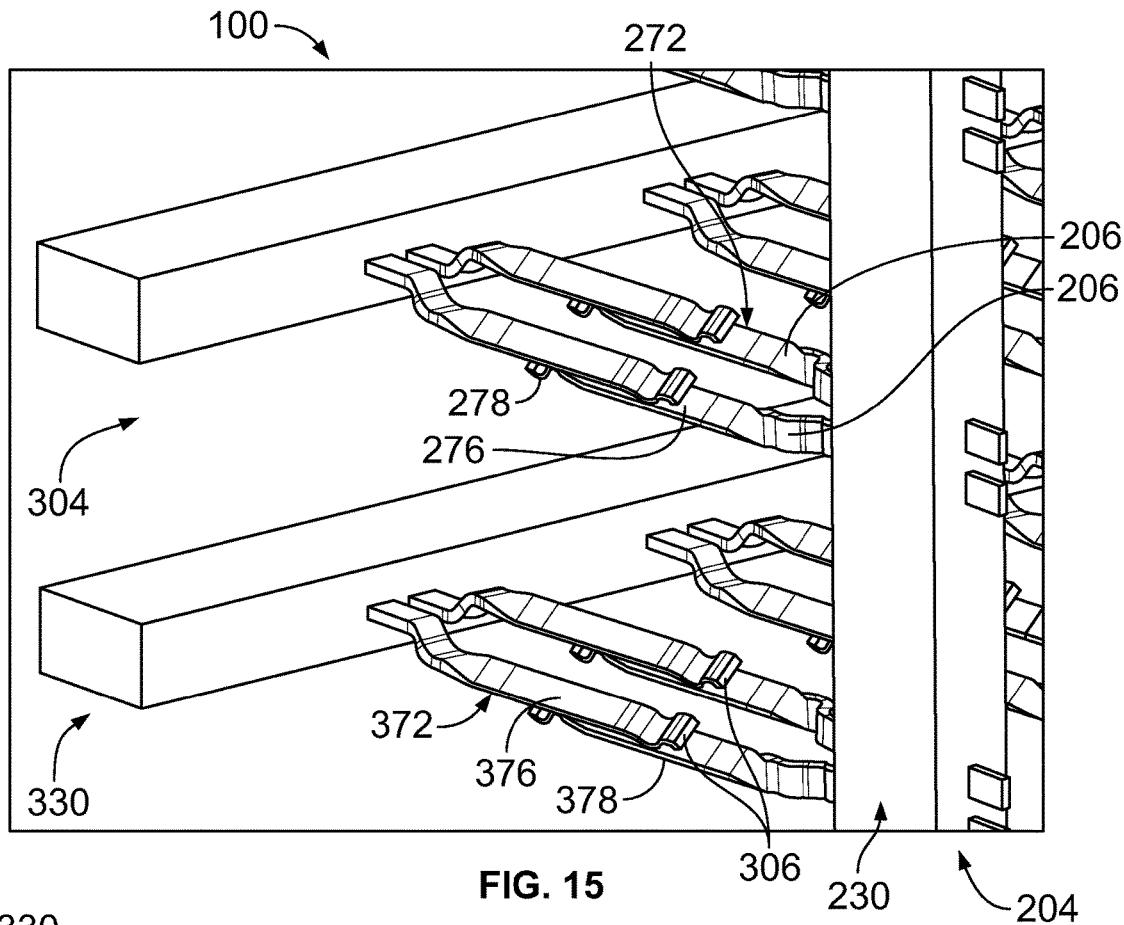
FIG. 15 is a perspective view of a portion of the communication system showing wafer assemblies of the first electrical connector mated with wafer assemblies of the second electrical connector in an exemplary embodiment.
Figure 16:
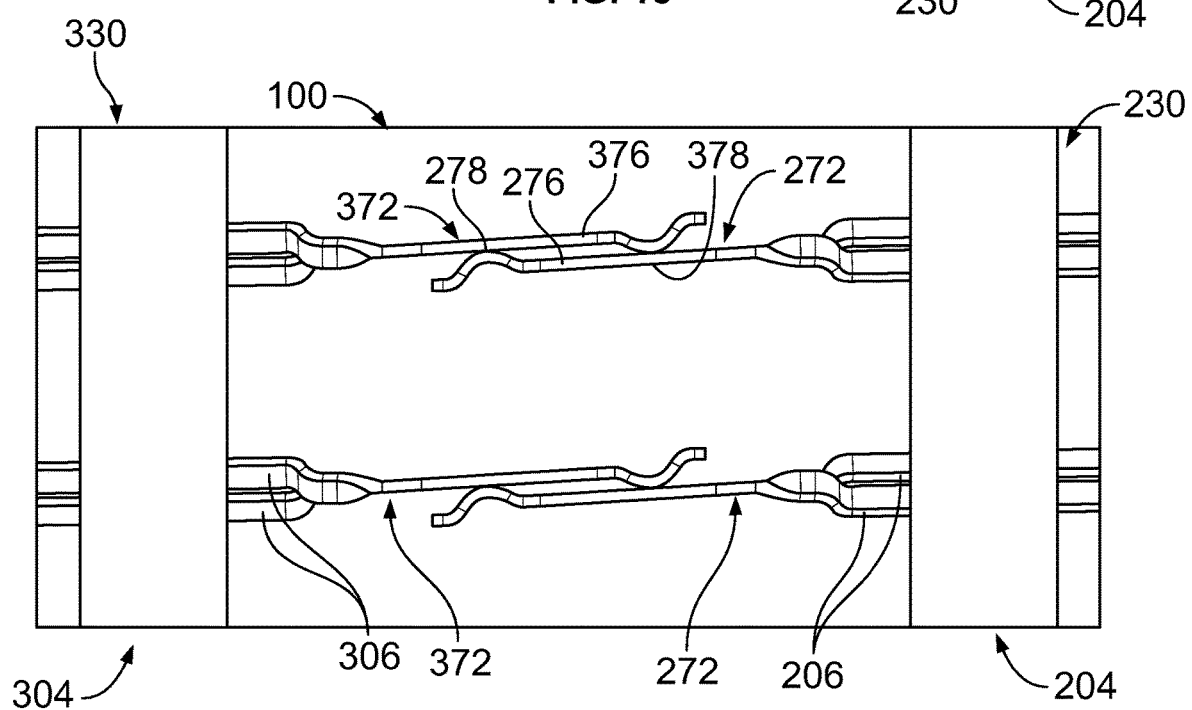
FIG. 16 illustrates a portion of the communication system showing wafer assemblies of the first electrical connector mated with wafer assemblies of the second electrical connector in an exemplary embodiment.

FIG. 14 is an end view of a portion of the communication system 100 showing wafer assemblies 230 of the first electrical connector 204 mated with wafer assemblies 330 of the second electrical connector 304. FIG. 15 is a perspective view of a portion of the communication system 100 showing wafer assemblies 230 of the first electrical connector 204 mated with wafer assemblies 330 of the second electrical connector 304. FIG. 16 illustrates a portion of the communication system 100 showing wafer assemblies 230 of the first electrical connector 204 mated with wafer assemblies 330 of the second electrical connector 304. Some of the wafer assemblies 230, 330 have been removed for clarity. The housings 210, 310 (shown in FIG. 13) have been removed for clarity.

In an exemplary embodiment, the mating interfaces defined by the signal contacts 206, 306 are hermaphroditic and identical to each other. The signal contacts 206, 306 are each angled 45° to form an orthogonal mating interface. For example, the signal contacts 206, 306 both have twisted mating interfaces that mate at the separable mating interface between the first and second electrical connectors 204, 304. The 45° twists in the signal contacts 206, 306 combine to form the 90° transition. The spring beams 272 of the first signal contacts 206 are oriented parallel to the spring beams 372 of the second signal contacts 306. In an exemplary embodiment, the first wafer assemblies 230 are oriented vertically and the second wafer assemblies 330 are oriented horizontally. The signal contacts 206 of the first wafer assemblies 230 are configured to be mated with signal contacts 306 from each of the second wafer assemblies 330. Similarly, the signal contacts 306 of the second wafer assemblies 330 are configured to be mated with signal contacts 206 from each of the first wafer assemblies 230.

The signal contacts 206 include the mating fingers 278 at the tips of the mating ends 272. Similarly, the signal contacts 306 include mating fingers 378 at the tips of mating ends 372 of the second signal contacts 306. When mated, the mating fingers 278 engage the spring beams 376 of the second signal contacts 306 remote from the mating fingers 378 and the mating fingers 378 engage the spring beams 276 of the first signal contacts 206 remote from the mating fingers 278. As such, the signal contacts 206, 306 have multiple points of contact with each other. The multiple points of contact along the length of the signal contacts 206, 306 reduce electrical stubs. The electrical stub lengths are limited to the tips of the signal contacts 206, 306 and beyond the points of contact. During mating, the mating fingers 278 may slide along the spring beams 376 of the second signal contacts 306 and the mating fingers 378 may slide along the spring beams 276 of the first signal contacts 206.

Figure 17:
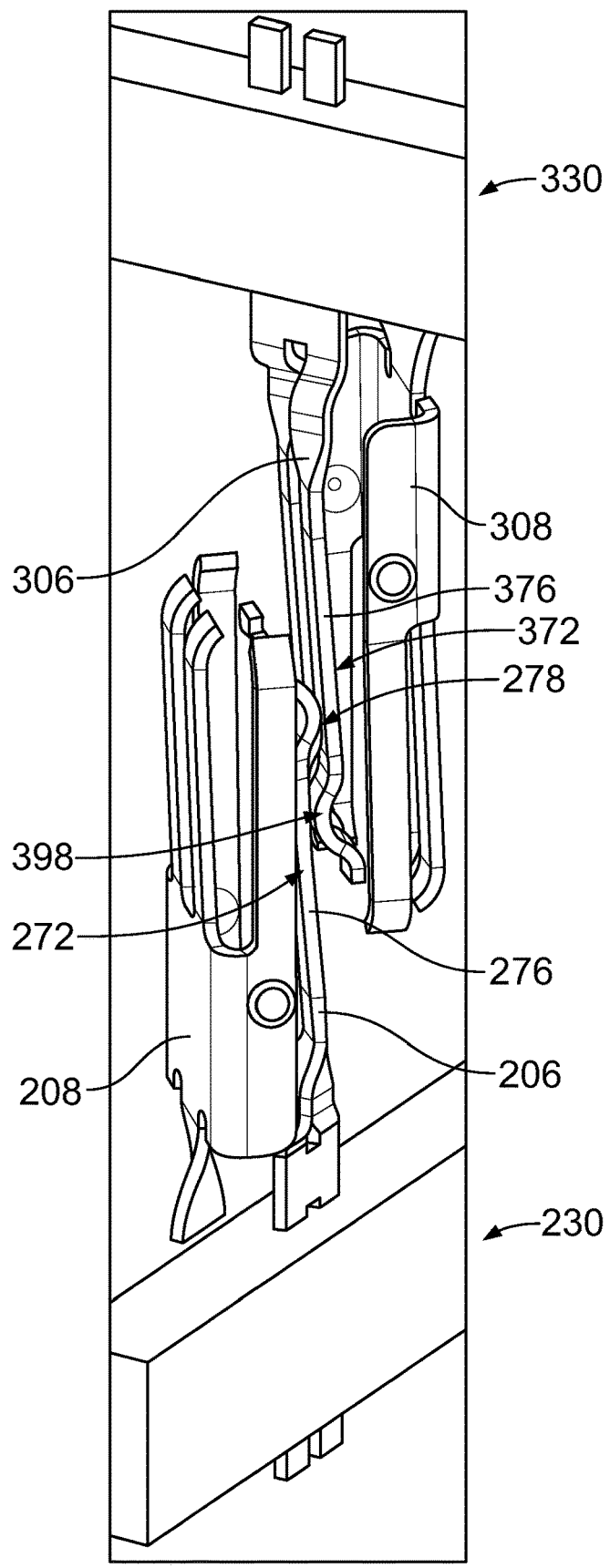
FIG. 17 is a sectional view of a portion of the communication system in accordance with an exemplary embodiment.

FIG. 17 is a sectional view of a portion of the communication system 100 in accordance with an exemplary embodiment. FIG. 17 illustrates the first and second signal contacts 206, 306 and the first and second ground shields 208, 308; however, the housings 210, 310 (shown in FIG. 13) are removed to illustrate the mating interface. FIG. 17 illustrates a portion of the first wafer assembly 230 and a portion of the second wafer assembly 330. The wafer assemblies 230, 330 are oriented perpendicular to each other. The signal contacts 206, 306 are both twisted 45° to transition between the orthogonal wafer assemblies 230, 330. The ground shields 208, 308 are both twisted 45° to transition between the orthogonal wafer assemblies 230, 330. The ground shields 208, 308 provide electrical shielding at the mating zone.

The mating fingers 278 of the signal contacts 206 and the mating fingers 378 of the second signal contacts 306 overlap each other and engage each other to electrically connect the first and second wafer assemblies 230, 330. The signal contacts 206, 306 have multiple points of contact with each other along the length of the signal contacts 206, 306 and form parallel signal paths through the communication system 100. The electrical stubs are limited to the lengths of the tips of the signal contacts 206, 306 beyond the points of contact. The ground shields 208, 308 provide the twisted shield zones for the mating ends 272, 372.

Figure 18:
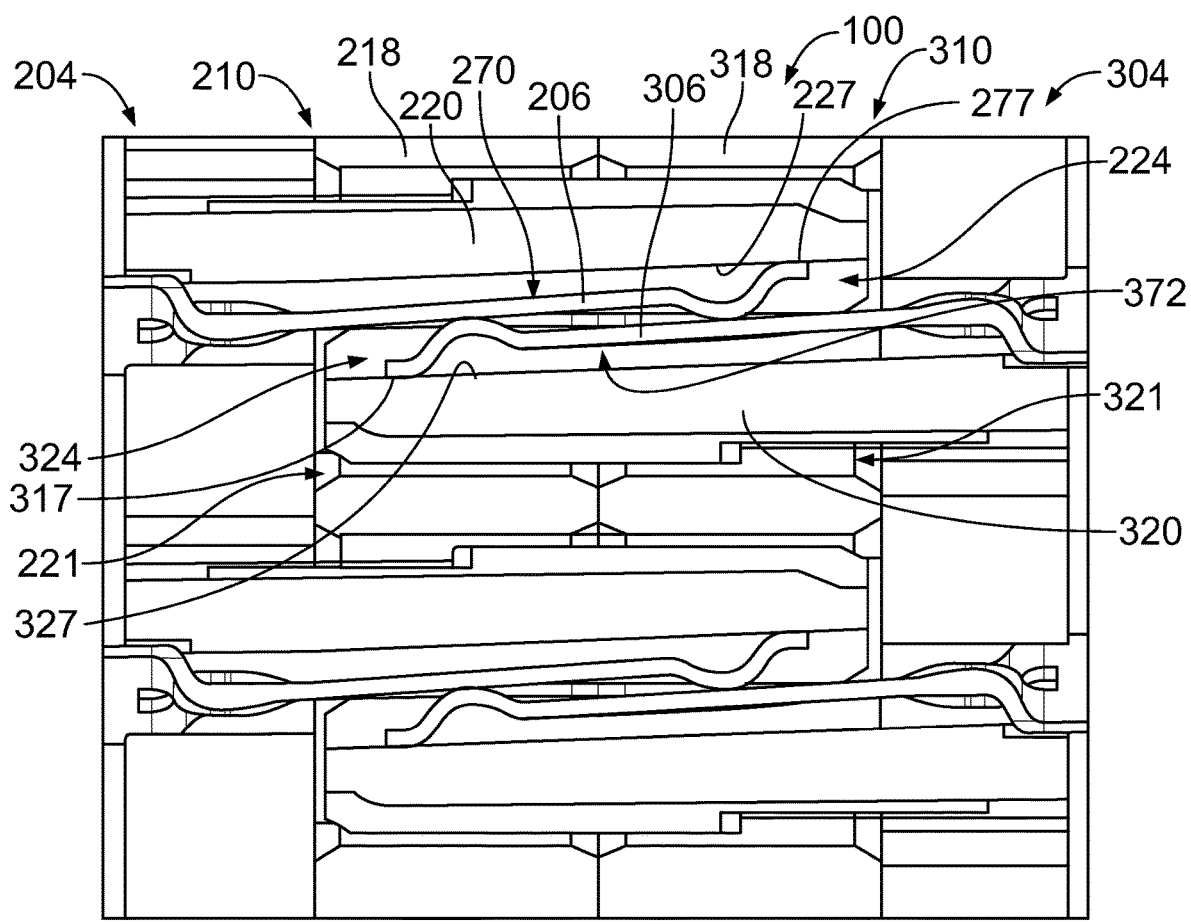
FIG. 18 is a sectional view of a portion of the communication system in accordance with an exemplary embodiment showing the first and second signal contacts mated with each other through the housings.

FIG. 18 is a sectional view of a portion of the communication system 100 in accordance with an exemplary embodiment showing the first and second signal contacts 206, 306 mated with each other through the housings 210, 310. When the first and second electrical connectors 204, 304 are mated, the towers 220, 320 overlap with each other through the openings 221, 321 in the commoning members 218, 318. The commoning members 218, 318 provide shielding for the mating ends 272, 372 of the signal contacts 206, 306.

In an exemplary embodiment, the housings 210, 310 include support surfaces 227, 327 in the signal contact pockets 224, 324 of the towers 220, 320, respectively. The support surfaces 227, 327 support the mating ends 272, 372 of the signal contacts 206, 306. In an exemplary embodiment, tips 277, 377 of the mating ends 272, 372 engage the support surfaces 227, 327 to locate the mating ends 272, 372 in the pockets 224, 324. Optionally, prior to mating, the tips 277, 377 may be spaced apart from the support surfaces 227, 327. During mating, the mating ends 272, 372 are deflected outward toward the support surfaces 227, 327 until the tips 277, 377 engage the support surfaces 227, 327. The mating ends 272, 372 bottom out against the support surfaces 227, 327.

Figure 19:
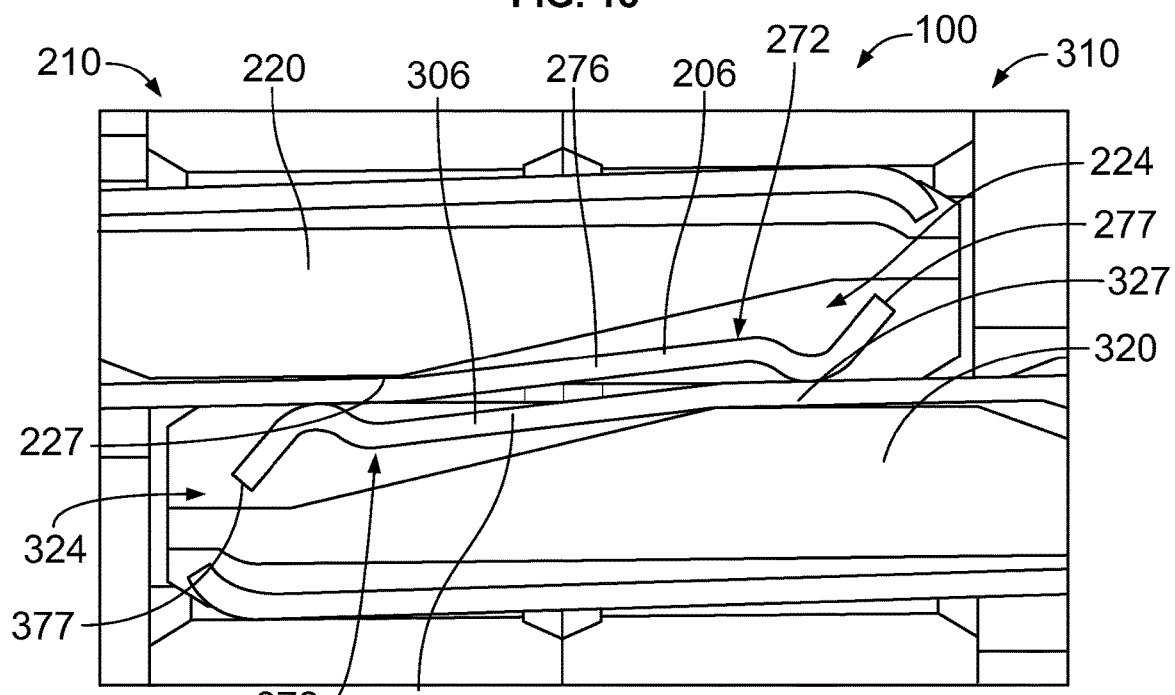
FIG. 19 is a sectional view of a portion of the communication system in accordance with an exemplary embodiment showing the first and second signal contacts mated with each other through the housings.

FIG. 19 is a sectional view of a portion of the communication system 100 in accordance with an exemplary embodiment showing the first and second signal contacts 206, 306 mated with each other through the housings 210, 310. The shape of the towers 220, 320 is different in the embodiment shown in FIG. 19 than the embodiment shown in FIG. 18. The signal contact pockets 224, 324 of the towers 220, 320 are shaped differently with the support surfaces 227, 327 at different locations than the embodiment shown in FIG. 18. The support surfaces 227, 327 are located closer to the roots of the mating ends 272, 372 (for example, remote from the tips 277, 377. The support surfaces 227, 327 support the mating ends 272, 372 of the signal contacts 206, 306. The spring beams 276, 376 are deflectable beyond the support surfaces 227, 327. For example, the tips 277, 377 may be deflected toward the tower walls during mating with each other. When mated, the signal contacts 206, 306 have multiple points of contact with each other, which reduces electrical stubs. The electrical stub lengths are limited to the tips of the signal contacts 206, 306 and beyond the points of contact. The support surfaces 227, 327 ensure that the contacts 206, 306 engage each other at multiple points.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector comprising:
a housing having a mating interface configured to be mated with a mating electrical connector; and
wafer assemblies coupled to the housing and arranged in a wafer stack, each wafer assembly including a leadframe and a wafer body holding the leadframe, the leadframe having signal contacts extending between mating ends and mounting ends, the signal contacts arranged in pairs, each pair including a primary signal contact of the signal contacts and a secondary signal contact of the signal contacts, the signal contacts having main bodies between the mating ends and the mounting ends, the main bodies extending through the wafer bodies, the mating ends extending from the wafer body and presented at the mating interface of the housing for mating with mating signal contacts of the mating electrical connector, the mating ends being twisted at an angle relative to the main bodies, wherein the mating end of the primary signal contact is arranged at a first side of the corresponding main body and the mating end of the secondary signal contact is arranged at a second side of the corresponding main body to define a twisted pair interface configured to be mated with the mating signal contacts of the mating electrical connector.

2. The electrical connector of claim 1, the mating ends of the first and secondary signal contacts are coplanar along a mating plane, the mating plane being oriented at 45° relative to a main body plane of the main body.

3. The electrical connector of claim 1, wherein the wafer body includes a front end extending along a front axis, the pairs of signal contacts spaced apart along the front axis, the twisted pair interface angled transverse to the front axis.

4. The electrical connector of claim 1, wherein each mating end includes a jog portion and a twist portion, the jog portion jogging the mating end out of plane relative to the corresponding main body, the twist portion twisting the mating end at a 45° angle relative to the corresponding main body.

5. The electrical connector of claim 4, wherein the jog portion of the primary signal contact is jogged in a first direction to the first side and the jog portion of the secondary signal contact is jogged in a second direction opposite the first direction to the second side.

6. The electrical connector of claim 1, wherein the housing and wafer assemblies form a hermaphroditic mating interface for mating with the mating electrical connector having a hermaphroditic mating interface identical to the hermaphroditic mating interface defined by the housing and the wafer assemblies.

7. The electrical connector of claim 1, wherein each signal contact has a first side and a second side opposite the first side, the first sides along the main bodies being coplanar, the second sides along the main bodies being coplanar, the first sides along the mating ends being oriented at 45° relative to the first sides along the main bodies, the second sides along the mating ends being oriented at 45° relative to the second sides along the main bodies.

8. The electrical connector of claim 1, wherein the wafer assembly includes a ground frame coupled to the wafer body to provide electrical shielding for the leadframe, the ground frame including ground shields extending along the mating ends of the corresponding pair of signal contacts to provide shielding for the mating ends of the corresponding pair of signal contacts, the ground shields being twisted 45° to define twisted shield zones along the mating ends of the signal contacts.

9. The electrical connector of claim 8, wherein each ground shield is C-shaped having an end wall between two side walls, the end wall being oriented generally parallel to the mating ends of the signal contacts.

10. An electrical connector comprising:
a housing having a mating interface configured to be mated with a mating electrical connector; and
wafer assemblies coupled to the housing and arranged in a wafer stack, each wafer assembly including a leadframe, a wafer body holding the leadframe, and a ground frame coupled to the wafer body to provide electrical shielding for the leadframe;
each leadframe having signal contacts extending between mating ends and mounting ends, the signal contacts arranged in pairs, each pair including a primary signal contact of the signal contacts and a secondary signal contact of the signal contacts, the signal contacts having main bodies between the mating ends and the mounting ends, the main bodies extending through the wafer bodies, the mating ends extending from the wafer body and presented at the mating interface of the housing for mating with mating signal contacts of the mating electrical connector, the mating ends being twisted 45° relative to the main bodies, wherein the mating end of the primary signal contact is arranged at a first side of the corresponding main body and the mating end of the secondary signal contact is arranged at a second side of the corresponding main body to define a twisted pair interface configured to be mated with the mating signal contacts of the mating electrical connector;
each ground frame having a ground plate coupled to the wafer body and ground shields extending forward from the ground plate, the ground shields extending along the mating ends of the corresponding pair of signal contacts to provide shielding for the mating ends of the corresponding pair of signal contacts, the ground shields being twisted 45° relative to the ground plate to define twisted shield zones along the mating ends of the signal contacts.

11. The electrical connector of claim 10, wherein each ground shield is C-shaped having an end wall between two side walls, the end wall being oriented generally parallel to the mating ends of the signal contacts.

12. The electrical connector of claim 10, wherein each ground shield is C-shaped having an end wall between two side walls, the end wall being oriented at 45° relative to the ground plate.

13. The electrical connector of claim 10, wherein each ground shield is C-shaped having an end wall between two side walls, the ground shield includes a transition portion between the end wall and the ground plate, the transition portion being twisted 45° to orient the end wall 45° relative to the ground plate.

14. The electrical connector of claim 10, the mating ends of the first and secondary signal contacts are coplanar along a mating plane, the mating plane being oriented at 45° relative to a main body plane of the main body.

15. The electrical connector of claim 10, wherein each mating end includes a jog portion and a twist portion, the jog portion jogging the mating end out of plane relative to the corresponding main body, the twist portion twisting the mating end at a 45° angle relative to the corresponding main body.

16. The electrical connector of claim 15, wherein the jog portion of the primary signal contact is jogged in a first direction to the first side and the jog portion of the secondary signal contact is jogged in a second direction opposite the first direction to the second side.

17. The electrical connector of claim 1, wherein the housing and wafer assemblies form a hermaphroditic mating interface for mating with the mating electrical connector having a hermaphroditic mating interface identical to the hermaphroditic mating interface defined by the housing and the wafer assemblies.

18. The electrical connector of claim 1, wherein each signal contact has a first side and a second side opposite the first side, the first sides along the main bodies being coplanar, the second sides along the main bodies being coplanar, the first sides along the mating ends being oriented at 45° relative to the first sides along the main bodies, the second sides along the mating ends being oriented at 45° relative to the second sides along the main bodies.

19. A communication system comprising:
a first circuit board assembly having a first circuit board and a first electrical connector mounted to the first circuit board, the first electrical connector having primary signal contacts, the primary signal contacts arranged in pairs, the primary signal contacts having main bodies between the mating ends and the mounting ends, the mating ends of the primary signal contacts being twisted 45° relative to the main bodies, wherein the mating ends of the primary signal contacts of each pair are arranged on opposite sides of the main bodies to define a first twisted pair interface; and
a second circuit board assembly having a second circuit board and a second electrical connector mounted to the second circuit board, the second electrical connector having secondary signal contacts, the secondary signal contacts arranged in pairs, the secondary signal contacts having main bodies between the mating ends and the mounting ends, the mating ends of the secondary signal contacts being twisted 45° relative to the main bodies, wherein the mating ends of the secondary signal contacts of each pair are arranged on opposite sides of the main bodies to define a second twisted pair interface, the second twisted pair interface configured to mate with the corresponding first twisted pair interface;
wherein the first and second electrical connectors are identical to each other each having a hermaphroditic mating interface defined by the first and secondary signal contacts;
wherein the first and second electrical connectors are mated such that the first circuit board is oriented perpendicular to the second circuit board.

20. The communication system of claim 19, wherein the first electrical connector includes first wafer assemblies held in a first wafer stack in a first housing and the second electrical connector includes second wafer assemblies held in a second wafer stack in a second housing, the first wafers oriented along first planes, the second wafers oriented along second planes perpendicular to the first planes, the primary signal contacts being twisted 45° relative to the first planes at the mating ends thereof, the secondary signal contacts being twisted 45° relative to the second planes at the mating ends thereof, the first ground shields being twisted 45° relative to the first planes, and the second ground shields being twisted 45° relative to the second planes.

* * * * *